(12) United States Patent
Maas et al.

(10) Patent No.: US 12,332,574 B2
(45) Date of Patent: Jun. 17, 2025

(54) LITHOGRAPHIC PATTERNING METHOD AND SYSTEM THEREFORE

(71) Applicant: Nederlandse Organisatie voor toegepast-natuurwetenschappelijk onderzoek TNO, 's-Gravenhage (NL)

(72) Inventors: Diederik Jan Maas, Breda (NL); Jacques Cor Johan Van Der Donck, Alphen aan Den Rijn (NL); Maarten Hubertus Van Es, Voorschoten (NL); Chien-Ching Wu, Delfgauw (NL); Klara Maturova, Pijnacker (NL); Robert Wilhelm Willekers, 's-Gravenhage (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 980 days.

(21) Appl. No.: 17/311,942

(22) PCT Filed: Dec. 13, 2019

(86) PCT No.: PCT/NL2019/050833
§ 371 (c)(1),
(2) Date: Jun. 8, 2021

(87) PCT Pub. No.: WO2020/122724
PCT Pub. Date: Jun. 18, 2020

(65) Prior Publication Data
US 2022/0057720 A1 Feb. 24, 2022

(30) Foreign Application Priority Data
Dec. 14, 2018 (EP) .................................... 18212663

(51) Int. Cl.
*G03F 7/00* (2006.01)

(52) U.S. Cl.
CPC ...... *G03F 7/70675* (2013.01); *G03F 7/70358* (2013.01); *G03F 7/70525* (2013.01); *G03F 7/7065* (2013.01)

(58) Field of Classification Search
None
See application file for complete search history.

(56) References Cited

U.S. PATENT DOCUMENTS

| 2005/0172704 A1 | 8/2005 | Mirkin et al. |
| 2005/0205776 A1 | 9/2005 | Dana et al. |

(Continued)

FOREIGN PATENT DOCUMENTS

| EP | 2500776 A2 * | 9/2012 | ......... G03F 7/70558 |
| EP | 2500776 A3 * | 12/2014 | ......... G03F 7/70558 |

(Continued)

OTHER PUBLICATIONS

Kwang-Woo Choi et al. ( "Effect of photoacid generator concentration and developer strength on the patterning capabilities of a model EUV photoresist". SPIE, PO Box 10 Bellingham WA 98227-0010 USA, vol. 6519, Apr. 12, 2007 (Apr. 12, 2007)).*

(Continued)

*Primary Examiner* — Andrew Smyth
(74) *Attorney, Agent, or Firm* — Leydig, Voit & Mayer, Ltd.

(57) ABSTRACT

Lithographic patterning method for creating features on a surface of a substrate, including the steps of: applying a resist material to the surface; performing resist processing steps, including at least: selectively exposing the resist material layer to a surface treatment step, wherein the resist material in the exposed locations is chemically modified; and developing the resist material layer to selectively remove the resist material locally. The method further comprises detecting, during or after the resist processing steps, (Continued)

a chemical modification of the resist material for monitoring or evaluating the processing steps. The step of detecting is performed by scanning the surface using a scanning probe microscopy device, and wherein the scanning includes contacting the surface with the probe tip in a probing area. The probing area coincides with at least one location of the exposed locations and non-exposed locations, for detecting the chemical modification. The document further describes a system.

20 Claims, 3 Drawing Sheets

(56) References Cited

U.S. PATENT DOCUMENTS

| | | | |
|---|---|---|---|
| 2014/0242520 A1 | 8/2014 | Lee et al. | |
| 2015/0234272 A1 | 8/2015 | Sarma et al. | |
| 2017/0011906 A1* | 1/2017 | Buckalew | H01L 24/03 |

FOREIGN PATENT DOCUMENTS

| | | | | |
|---|---|---|---|---|
| JP | 11-174065 | | 7/1999 | |
| TW | 200413538 A | * | 8/2004 | B82Y 30/00 |
| WO | WO-2015069658 A1 | * | 5/2015 | G03F 1/22 |

OTHER PUBLICATIONS

European Patent Office, International Search Report in corresponding International Application No. PCT/NL2019/050833 dated Apr. 1, 2020 (3 pages).

John T. Woodward et al., Characterization of the latent image to developed image in model EUV photoresists SPIE, PO Box 10 Bellingham WA 98227-0010 USA vol. 6923 (2008) XP040435656.

Kwang-Woo Choi et al., "Effect of photoacid generator concentratoin and developer strength on the patterning capabilities of a model EUV photoresist" SPIE, PO Box 10 Bellingham WA 98227-0010 USA vol. 6519 (2007) XP040238183.

H Koop et al., "In situ direct visualization of irradiated electron-beam patterns on unprocessed resists using atomic force microscopy", Journal of Vacuum Science and Technology: Part B, 20100712 AVS / AIP, Melville, New York, NY, US—ISSN 1071-1023, vol. 28, Nr:4, pp. 802-805 XP012144194.

Korean Patent Office, Examination Report in corresponding Korean Patent Application No. 10-2021-7019836 dated Aug. 7, 2024.

Joe Sakai et al., "Pump-probe STM light emission spectroscopy for detection of photo-induced semiconductor—metal phase transition of VO2," Journal of Physics: Condensed Matter 29 (2017) 405001 (7 pages).

K. Sinthiptharakoon et al., "Conductive scanning probe microscopy of the semicontinuous gold film and its SERS enhancement toward two-step photo-induced charge transfer and effect of the supportive layer," Applied Surface Science 441 (2018) pp. 364-371.

* cited by examiner

LITHOGRAPHIC PATTERNING METHOD AND SYSTEM THEREFORE

CROSS-REFERENCE TO RELATED APPLICATIONS

This patent application is a U.S. National Phase of PCT International Application No. PCT/NL2019/050833, filed Dec. 13, 2019, which claims priority to European Application No. 18212663.1, filed Dec. 14, 2018, which are both expressly incorporated by reference in their entireties, including any references contained therein.

FIELD OF THE INVENTION

The present invention is directed at a lithographic patterning method for creating features on a surface of a substrate, the patterning method including the steps of applying a resist material to the substrate surface for providing a resist material layer; performing one or more resist processing steps, including at least selectively exposing, dependent on a location and based on patterning data, the resist material layer to a surface treatment step, such as to provide exposed locations and non-exposed locations, wherein the resist material in the exposed locations is chemically modified during the step of selective exposing; and developing the resist material layer such as to selectively remove the resist material locally, dependent on whether a location is an exposed location or a non-exposed location. The invention is further directed at a system for performing a lithographic patterning method as described above.

BACKGROUND

Nanolithography is concerned with the creation of structures or patterns of nanometer scale, and is for example applied to manufacture the tiniest structures in semiconductor elements. The field of nanolithography, for that reason, is of continuing growing interest to the semiconductor industry, as it enables to meet the requirements underlying technological advancement in many kinds of areas of application. Nanolithography is the collective name for a number of different technologies that allow the fabrication of such nanometer scale structures. Although some of these technologies substantially differ from the others, a majority of nanolithography methods have the abovementioned steps in common. A resist material layer is formed on a substrate, and the resist material is exposed to a treatment step to induce a chemical modification. This, subsequently allows the application of a development step for the selective removal of only the chemically modified material (or, alternatively, the removal of only the chemically unmodified material). In some cases, the structures are thereby directly formed from the resist material, but in most cases the selective removal of resist material results in the resist material layer to provide a patterned mask for a subsequent step, such as etching of the substrate material underneath.

One disadvantage of the above technology is the lack of control over the exposure step and subsequent steps that bring about the chemical modifications needed to perform patterning. To control the quality of a lithographic exposure step in a semiconductor factory, and thus maintain a viably high yield, the critical dimensions (CD) of the pattern are to be measured and monitored. Currently, as an additional challenge, exposed DUV and EUV resists typically need additional process steps, such as post-exposure bake, rinse and final bake, before any metrology can be performed. These steps may be critical in final pattern fidelity but cannot be monitored because the tools that allow the resolution, such as EUV or X-ray radiation or electron microscopy all directly influence the resist. Current metrology tools need completely developed resist to generate a significant and reliable physical signal for imaging the patterns to enable quality control.

The measuring of critical dimensions and the detection of defects therein is therefore only possible after the development step. Once developed, it is possible to verify the critical dimensions and detect any defects, however at that time it is no longer possible to make corrections. If excursions outside the process window are detected, the last exposure step must be considered lost and a corrective action (e.g. rework cycle) is needed.

Thus, although the selective exposure step can be performed accurately, there is no way of checking whether the results of that step are satisfactory. Moreover, during each of the additional processing steps after exposure, the high-resolution latent image is modified in both a wanted and an unwanted direction. Under current practice, optimizing all these steps simultaneously is the skill and trade secret of each yield engineer in the factory. However, the yield and quality of the process would greatly benefit from an increased level of insight and control over the various processing steps of a lithographic patterning method.

SUMMARY OF THE INVENTION

It is an object of the present invention to resolve the abovementioned disadvantages and to provide a lithographic patterning method which provides such an increased level of insight and control over various processing steps.

To this end, there is provided herewith a lithographic patterning method for creating features on a surface of a substrate, the patterning method including the steps of: applying a resist material to the substrate surface for providing a resist material layer; performing one or more resist processing steps, including at least: selectively exposing, dependent on a location and based on patterning data, the resist material layer to a surface treatment step, such as to provide exposed locations and non-exposed locations, wherein the resist material in the exposed locations is chemically modified during the step of selective exposing; and developing the resist material layer such as to selectively remove the resist material locally, dependent on whether a location is an exposed location or a non-exposed location; wherein the method further comprises a step of detecting, during or after one or more of the resist processing steps, a chemical modification of the resist material for monitoring or evaluating the one or more resist processing steps, wherein the step of detecting is performed by scanning at least a part of the surface using a scanning probe microscopy device including a probe comprising a cantilever and a probe tip arranged on the cantilever, and wherein the scanning includes following the surface with the probe tip in a probing area, wherein the probing area coincides with at least one location of the exposed locations and non-exposed locations, for detecting the chemical modification.

The present invention adds an additional verification step (or steps) to be performed during or after patterning, prior to the development of the resist. In this stage, upon detection of any defects it is still possible to correct the patterning process to prevent loss of the device to be produced. Specifically, the present invention proposes to perform a step of detecting, during or after any of these resist processing steps, a chemical modification of the resist material for monitoring or evaluating the process. This insight in the chemical processes ongoing or performed during the resist processing steps may be obtained, in accordance with the invention, by scanning at least a part of the surface using a scanning probe microscopy (SPM) device.

The scanning probe microscopy device includes a scan head which bears a probe comprising a cantilever and a probe tip arranged on the cantilever. The scanning includes following the surface with the probe tip in a probing area. The probing area coincides with one or more of the exposed locations and non-exposed locations. By 'following the surface' it is meant that the scanning probe microscopy device may be operated in any of the known contact-modes, non-contact modes, or intermittent contact modes; the probe tip thus being in contact or non-contact with the surface at least periodically to perform measurements. The 'following' thus includes bringing the probe tip in contact or close proximity with the surface at the probing area, or bringing an oscillating probe tip in close proximity of the surface with or without making intermittent contact at the probing area. In the present document, reference is many times made to the probe tip 'contacting' or being in 'contact' with the surface, but in all these cases it is to be understood that this is to be interpreted as 'following' as explained here. As will be appreciated, during said 'following', there is interaction between probe tip and surface via various mechanisms.

The term 'resist' or 'resist material' used in this document includes all materials and functional layers of any kind or type that may be used as resist in a lithographic patterning method. For example, taking directed self-assembled lithography into account, block copolymers applied therein are typically not named as resist but they do function as resist after treatment. Such layers are thus intended to be covered by the present disclosure.

In particular, SPM technologies are applied that provide insight in the chemical composition or processes ongoing for detecting the chemical modifications brought about in the various resist processing steps. For example, some SPM technologies enable to perform spectroscopy at the very high resolutions obtainable with SPM, in order to gain insight in a chemical composition or to detect local differences in the chemical composition (i.e. chemical modifications), or local differences in material properties that reveal such chemical modifications. In some other SPM technologies, the probe tip interacts differently with the substrate surface dependent on the chemical composition thereof. For example, performing a topography and recognition (TREC) measurement process using a chemically functionalized probe tip provides for such an SPM technology. Even other SPM technologies include conductive atomic force microscopy (CAFM) methods, such as I-V (current-voltage) spectroscopy wherein a local I-V characteristic is obtained to gain insight in electrical properties indicative of said chemical modifications. Preferably, in all these technologies, the detected chemical modifications are even quantifiable to gain insight in the stage of a chemical process. Hence, in more sophisticated embodiments, not merely the chemical modifications may be detected but also the degree of progress of a chemical process ongoing in the resist material, or the concentration of a chemical substance, or some characteristic such as acidity from which this information is derivable.

The term 'cantilever' includes a whole range of various types of cantilever designs, and is not limited to any specific type of cantilever. The same is true for the term 'probe tip' which may include all kinds of standard and specialized probe tips used for various purposes in an SPM. For example, cantilevers include standard straight cantilever designs, but also tuning forks, bridge structures, membranes, plate-like structures, various cross sections or many different shapes with two or more interconnected beams. The invention is not limited to a specific type of cantilever or probe tip. Furthermore, it is to be understood that in case use is made of a tuning fork, no optical deflection beam is used to determine the position. Instead the measurement of the oscillation amplitude uses the piezoelectric effect native to quartz crystal, yielding an electric signal correlated to the applied force.

In some specific embodiments, the step of detecting further comprises
directing a first optical beam onto the probe tip and detecting a reflected fraction of the first optical beam by an optical beam deflection sensor for measuring a position of the probe tip relative to the surface; directing a second optical beam at the probing area on the surface, wherein the second optical beam is a pulsed infrared (IR) laser beam; and monitoring the measured position of the probe tip for obtaining a sensor signal indicative of infrared absorption at the probing area. The second optical beam of pulsed IR radiation is at least partially absorbed by the material upon which it is incident, but the degree of IR absorption and IR absorption spectrum is dependent on the chemical composition. Upon absorption of IR radiation, thermal expansion of the sample occurs, causing the AFM probe in contact with the surface to oscillate at its resonant frequency. The oscillations are detected by the reflected fraction's position on the optical beam deflection sensor, and the amplitude of oscillation is proportional to IR absorbance, yielding an IR spectrum as a function of wavelength. In accordance with other embodiments, the probe tip is provided with a functional coating, the functional coating comprising at least one of a metal, silicon or silicon oxide, and wherein the step of detecting further comprises: directing an optical excitation beam at the probing area, wherein the optical excitation beam is an infrared laser beam; collecting a scattered fraction of the optical excitation beam; and analyzing the scattered fraction for detecting variations in a molecular structure at the probing area, such as to provide a sensor signal indicative of said variations.

In these embodiments, the probe tip is coated with a functional coating comprising at least one of a metal, silicon or silicon oxide. As a result of the functional coated probe tip being in contact with the surface while the probing area is being irradiated with IR radiation, surface plasmons provide a strong enhancement of the electromagnetic field between probe tip and sample. However, this is spatially confined to the order of the probe tip size. More absorbance means less photons are being scattered to be detected by a collection mirror or lens. Preferably, near-field and far-field contributions are separated in the analysis to correct for the differences in the size of the tip and the spot size of the excitation beam. The probe tip enhances field significantly, but the spot size is also significantly larger than tip size. In different implementations, the intensity and optical spectrum of the excitation beam may also be different dependent on the needs. For example, with enough photons (think synchrotron radiation), broadband IR irradiation may be used to directly acquire spectra at each location. Alternatively, a single wavelength may be used for imaging, or the wavelength is scanned at each location to obtain spectra.

In some embodiments, the probe tip is provided with a functional coating, the functional coating comprising at least one of a metal, silicon or silicon oxide, and the step of detecting further comprises: directing an optical excitation beam at the probing area, wherein the optical excitation beam comprises a laser beam of visible light; collecting a Raman scattered fraction of the optical excitation beam scattered at the probing area; and analyzing the Raman scattered fraction using a spectrometer for obtaining a Raman spectrum of the resist material at the probing area, such as to provide a sensor signal indicative of a chemical composition. This method applies an AFM enhanced Raman spectroscopy technology to gain insight in the chemical composition at each location. These embodiments are similar to the embodiments above, with the difference that in these embodiments visible laser light is applied to excite the surface locally. Absorbed photons are re-emitted with lower energy as some energy has been lost to molecular vibrations. Re-emitted photons are collected and put through a spectrometer to get a Raman spectrum. The Raman spectrum may be analyzed to provide detailed information on the local state of the resist material, such as chemical structure, phase and polymorphy, crystallinity and molecular interactions. In Raman spectroscopy, incident light from the excitation beam is scattered at molecular level by the resist material, providing a very large scattered fraction of a same wavelength (Rayleigh scattered fraction) as the excitation beam and a very small scattered fraction of a different wavelength (Raman scattered fraction) than the excitation beam. The Raman scattered fraction provides the abovementioned detailed information desired to detect and quantify the chemical modifications.

In yet other embodiments, the probe is electrically conductive, and the step of detecting further comprises applying, to the probe tip while in contact with the probing area, one or more bias voltages of a range of bias voltages; and measuring an electric current through the probe tip in response to the one or more bias voltages, for obtaining a voltage-current relation at the probing area. These embodiments provide more insight in the electrical properties at each location measured. The analysis of electrical characteristics works well with some specific types of resist for the same purpose of identifying the chemical modifications in the exposed resist. For example, this type of analysis may be applied in combination with other SPM technologies to identify chemical modifications in chemically amplified resists, such as poly(4-hydroxyl styrene-co-t-butoxycarbonyloxystyrene).

Yet, in accordance with some further embodiments, the step of detecting comprises a scanning probe microscopy chemical imaging step, preferably including one or more elements of a group comprising: topography and recognition imaging (TREC), or chemical force microscopy with a functionalized probe tip. These methods may be applied to evaluate the acidity at the surface of the resist, which may be indicative of ongoing chemical processes in the resist material.

The photoresist material in a lithographic patterning method of the present invention may be any desired type of photoresist material, and is not limited to certain materials in particular. Some examples are provided here for explanatory purposes. For example, the photoresist material may comprise at least one element of a group comprising: a non-chemically amplified resists, such as diazonaphtoquinone-5-sulfanate (DNQ); a chemically amplified resist, such as poly(4-hydroxyl styrene-co-t-butoxycarbonyloxystyrene); resists comprising hafnium oxide nanoparticles; and resists comprising zirconium oxide nanoparticles.

In accordance with the invention, the lithographic patterning method, based on the detected chemical modifications, comprises a step of: modifying one or more operational parameters of at least one of the resist processing steps dependent on the detected chemical modification. The main advantage of acquiring the additional information on the chemical modifications and chemical structure of the resist material during the processing steps, is that it allows the patterning method to be optimized. Therefore, in accordance with these embodiments, one or more operational parameters of the resist processing steps may be updated, calibrated, or tuned to improve the outcome of the method. This may be done while the resist processing step is ongoing, such as to improve the outcome of the method in progress. It may, however, also be done after the method is carried out for a present wafer or substrate, such as to improve the outcome for a next wafer or substrate.

As an example to the above, and in accordance with some embodiments, the method is applied to a first substrate and is to be subsequently applied to a second substrate, and wherein after the resist processing steps have been performed for the first substrate and based on the detected chemical modifications, the method further comprises a step of: modifying, for the second substrate, a chemical composition of the resist material to be applied to a substrate surface of the second substrate. In these embodiments, the chemical composition of the resist material to be applied to the next wafer or substrate is modified, for example to prevent or reduce an inadvertent effect that has been detected during the detection step performed for the present substrate. For example, if applying the resist material comprises a step of mixing one or more chemical substances, this step could include: adapting the mixture, e.g. the weight ratio or volumetric ratio of the chemical substances that are used as the components of the mixture; adding further chemical substances to the mixture, removing chemical substances from the mixture; or applying a completely different resist material or mixture of substances.

According to some embodiments of the invention, the step of detecting is performed by at least one of: scanning the at least part of the surface of the substrate multiple times such as to perform at least two of the SPM methods described above; or scanning the at least part of the surface of the substrate simultaneously with a plurality of probes, such as to perform at least two of the SPM methods described above; wherein the method further comprises combining of measurement data obtained by said scanning for detecting the chemical modification. The combination of chemical maps obtained by multiple scans or scans of multiple probes provides additional information on the ongoing chemical processes.

In a second aspect, there is provided a system for performing a lithographic patterning method for creating features on a surface of a substrate, wherein the system comprises: a lithography server, the lithography server being configured for at least one of controlling the lithographic patterning method and for acquiring data for monitoring or evaluating one or more resist processing steps of the lithographic patterning method; an applicator for applying a resist material to a surface of a substrate for providing a resist material layer; an exposure unit for selectively exposing, dependent on a location and based on patterning data, the resist material layer to a surface treatment step, such as to provide exposed locations and non-exposed locations, wherein the resist material in the exposed locations is chemically modified during the step of selective exposing; and a developer unit for developing the resist material layer such as to selectively remove the resist material locally, dependent on whether a location is an exposed location or a non-exposed location; wherein the lithography server is configured for obtaining, during or after one or more of the resist processing steps, data indicative of a chemical modification of the resist material for monitoring or evaluating the one or more resist processing steps, wherein the lithography server cooperates with a scanning probe microscopy device for detecting the chemical modification and providing the data, wherein the scanning probe microscopy device is configured for scanning at least a part of the surface and wherein the scanning probe microscopy device includes a probe comprising a cantilever and a probe tip arranged on the cantilever, and wherein the scanning probe microscopy device is configured for contacting the surface with the probe tip in a probing area, such that the probing area coincides with at least one location of the exposed locations and non-exposed locations, for detecting the chemical modification.

BRIEF DESCRIPTION OF THE DRAWINGS

The invention will further be elucidated by description of some specific embodiments thereof, making reference to the attached drawings. The detailed description provides examples of possible implementations of the invention, but is not to be regarded as describing the only embodiments falling under the scope. The scope of the invention is defined in the claims, and the description is to be regarded as illustrative without being restrictive on the invention. In the drawings:

DETAILED DESCRIPTION

Figure 1:
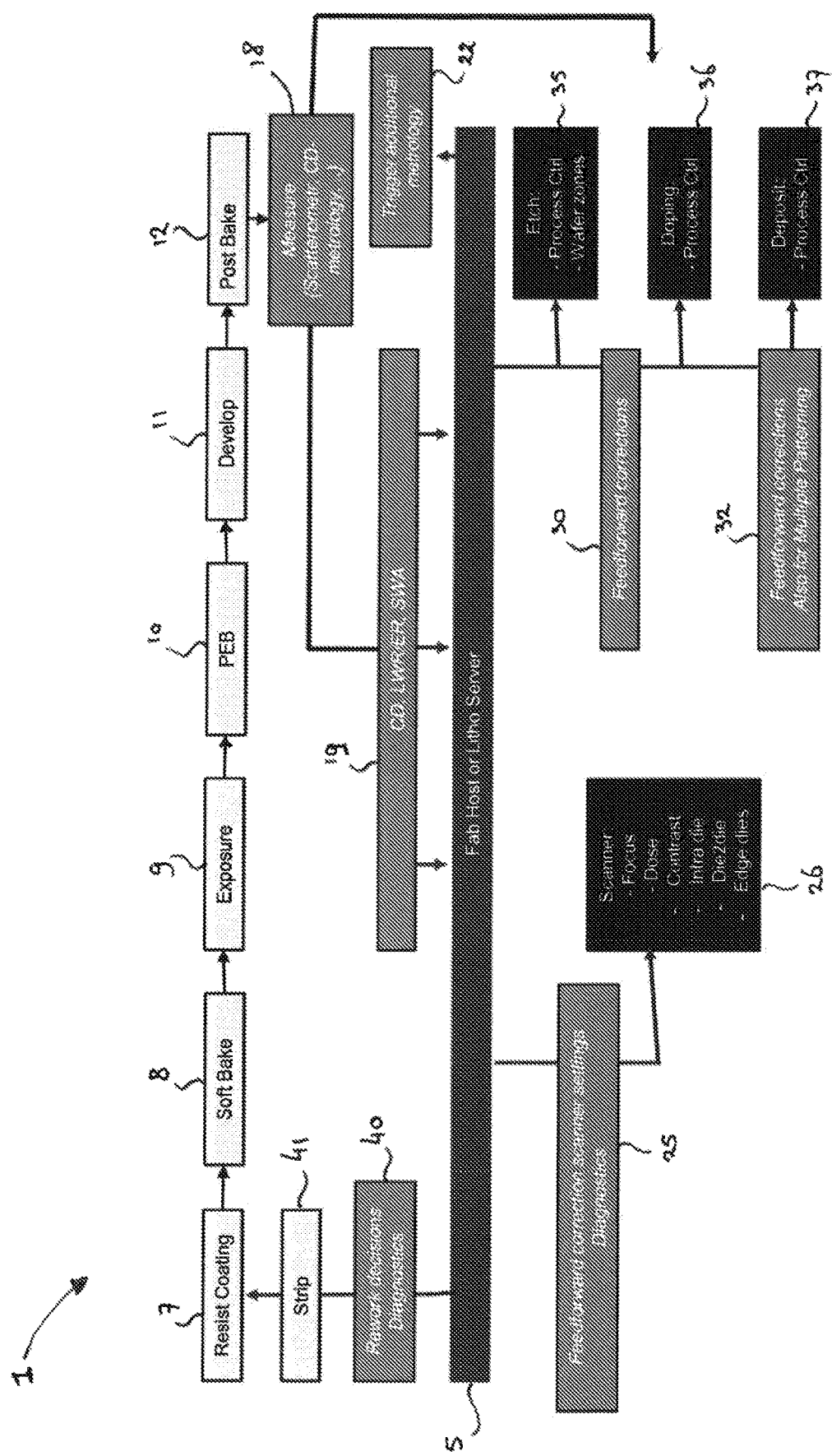
FIG. 1 schematically illustrates a conventional lithographic patterning method and control thereof.

FIG. 1 schematically illustrates a lithographic patterning method. The method 1 illustrated in FIG. 1 is controlled by a lithography server 5. The server 5 is illustrated as a single entity, but this may be a distributed computing task. For example, the server 5 may in reality consist of a plurality of controllers that may exchange information, or a master-slave type of architecture some of the control decisions are taken centrally and some by local controllers. As will be appreciated, the use of a single server 5 that controls the method in absence of other control logic is also one of the embodiments.

The server 5 controls how wafers are conveyed through the various processing units and devices of the system. Also, the system sets, deletes and corrects various operational parameters of the devices and units involved, for controlling the various processing steps performed during the method. This may be achieved on the basis of certain detected events in the process, or process conditions, alarms, measurement values, external input from an operator, and any other obtainable relevant information for the server 5 to control the process. Steps 40 and 41 will be explained further down below, as these steps only come into play in case a patterning of a wafer has to be reworked after detecting for example a defect. In principle, for each layer to be patterned, the process may start with a step of applying 7a layer of resist material to a substrate (such as a wafer). The layer may be applied for example by spin coating, although other methods of applying the layer of resist material are also possible such as, a chemical vapour deposition method, a physical vapor deposition method, spraying, sputtering, powder coating, a roll-to-roll type coating method (e.g. air knife coating, hot melt coating, immersion dip coating, roll-to-roll ALD, etc.), or any other suitable coating method. The application step 7 is performed to produce a uniform, adherent, and defect-free photoresist film of correct thickness over the wafer. Optionally, prior to step 7, other processing steps may be applied (other than 40 and 41) to prepare the wafer for the resist layer (e.g. remove contaminants, moist, or improve surface properties). These are not described here, but may be part of such a process.

The application step 7 is followed by a soft bake step 8. The soft bake step 8 solidifies the resist material (at least partly) by driving away solvents and by annealing. Soft baking requires a heater unit, e.g. an oven, that is capable of providing a very clean environment and a uniformly distributed temperature. Thereafter, the wafer is conveyed to the exposure unit such as to undergo selective exposure 9 of the resist material. The selective exposure of the resist material may be performed based on patterning data obtained from server 5 or another suitable data source used in the process. The patterning data may specify at least for the respective layer to be formed, where on the surface of the resist material layer the exposure is to take place such as to locally modify the resist material in that location. For example, the patterning data may contain layer data including a surface map or a matrix resembling the surface, wherein for each location on the surface it is indicated whether or not the treatment step is to be performed. This may simply be a bitmap indicating with Boolean values whether or not treatment is to take place at the given location. However, additional data may likewise be provided per location or per 'pixel', for example indicating preferred treatment parameters for that pixel (such as intensity, frequency, duration, or any other relevant parameter). The patterning data may relate to one or more layers to be patterned or may contain layer data of all layers to be created for the device. Moreover, this patterning data may be available in a single data file or in several complementary data files. Alternatively, the exposure may be performed using a mask of any kind. The mask defines the areas of the resist surface that will be exposed to radiation. The other areas will be covered.

The chemical properties of the exposed locations of the resist material change. Therefore, the exposure step 9 results in chemical modifications of the resist material dependent on whether a location is an exposed location or a non-exposed location. The nature of the chemical modifications is further dependent on the type of resist, and on the resist material. For example, exposed locations of a positive photoresist may become more soluble to a developer material used in the developer, the exposure thereby forming a positive image of the pattern on the wafer. Similarly. exposed locations of a negative resist may form a negative image of the pattern under influence of the same developer. Furthermore, the chemical processes that modify the resist during exposure are different for different resist materials. The exposure may typically be performed in a litho scanner as exposure unit.

In step 10, after the selective exposure step 9, a post-exposure bake step may be performed. Whether or not the post-exposure baking step 10 is to be carried out during the process depends, amongst others, on the type of resist material used. For some resist materials, for example chemically amplified resists, the post-exposure bake 10 is a critical step, without which no pattern may be formed. For other resist materials, the post-exposure bake 10 is merely optional. For example, in a photoresist based on DNQ, a post-exposure bake step 10 causes smoothing of the pattern which may be advantages in some circumstances. The post-exposure bake step 10 is therefore overall an optional step of the process 1.

In step 11, the photoresist material is developed. The development step causes location dependent selective removal of photoresist material, dependent on whether the location is an exposed location or an unexposed location. As explained above, this in turn is dependent on whether a positive or negative resist material is used. For negative resist materials, the resist material in the unexposed locations is removed (or removed more quickly than in the exposed locations). The development step thereby results in the development of the pattern to be formed.

Next, in step 12, a post bake or hard bake is carried out to stabilize the formed pattern on the wafer and to prepare the formed pattern for a subsequent etching step 35. The processing steps performed after the patterning method itself has been carried out typically include etching 35, doping 36 or occasionally depositing 37. The latter step 37 may be performed to form sophisticated semiconductor features, or in some cases to correct for small defects that are repairable.

In the process 1 of FIG. 1, in order to control the process or to optimize certain steps, the server 5 requires process data. For example, as indicated in box 19, the server 5 requires critical dimension (CD) data, line width roughness (LWR) data, edge roughness (ER) data, and side wall angle (SWA) data. This data may be obtained using various measurement techniques, such as optical metrology or scanning electron microscopy (SEM), in step 18. However, as explained in the introductory part of this document, this step may only be performed after the development step 11—or even the post bake step 12—has been carried out. The server 5 uses this data to control various process parameters, for example by feedforward step 25 to control operational parameters of the Litho scanner device, i.e. the exposure unit for carrying out step 9. Such various parameters, as indicated in box 26 of FIG. 1, include amongst others focus, dose, and contrast of the scanner. Furthermore in feedforward steps 30 and 32, the server 5 controls the various operational parameters of the etching process 35, the doping process 36 and the deposit process 37. Furthermore, the server 5 also uses this information to decide on step 40 for a certain wafer. Step 40 is a reworking step, and may be performed in case the server decides to remove a full photoresist layer such as to redo the patterning process for that wafer. In step 40, diagnostics are performed to decide on whether a wafer can be repaired in this manner and what would be required to rework the wafer. Next, in step 41, the wafer is stripped of its last applied resist layer, and is passed on to step 7 again. The server, from the process data illustrated in box 19, has determined how to correct the operational parameters of any of steps 7-12, and re-performs the patterning.

Figure 2:
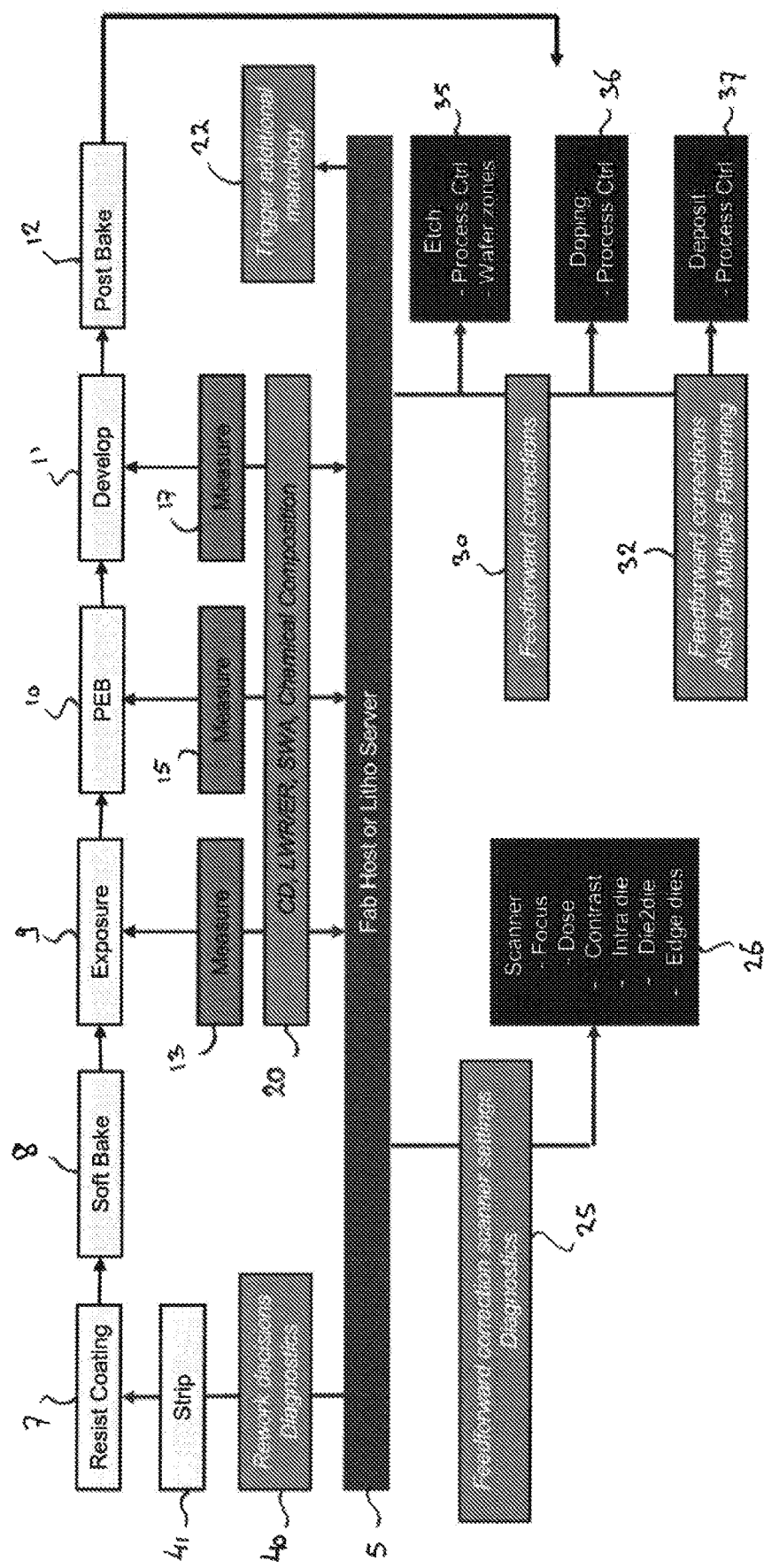
FIG. 2 schematically illustrates a lithographic patterning method and control thereof in accordance with an embodiment of the present invention.

FIG. 2 illustrates a lithographic patterning method in accordance with an embodiment of the present invention. Steps in FIG. 2 that are similar or even equivalent to the steps in the process of FIG. 1 have been designated with a same reference numeral. These steps are for that reason not described again below, and the skilled reader may appreciate that these steps may be applied in a similar manner, mutatis mutandis, in the process of FIG. 2.

In the process illustrated in FIG. 2, detection steps or measuring steps 13, 15 and 17 are performed directly during or after the processing steps 9-11, i.e. the exposure step 9, the post exposure bake step 10 and the developing step 11. These detection steps 13, 15, and 17 are performed using a scanning probe microscopy device 70 (FIG. 3) that is suitable for performing a chemical imaging step, i.e. an imaging step that is able to detect chemical modifications, e.g. by chemical composition, material properties, comparison or the like. Such technologies include atomic force microscopy based photothermal infrared (AFM-PTIR) spectroscopy (or in short PTIR), scanning scattering nearfield optical microscopy (sSNOM), tip enhanced raman spectroscopy (TERS), chemical force microscopy (CFM) with functionalised tip, or I-V spectroscopy. In addition to the data obtainable from step 18 in the process of FIG. 1, as indicated in box 20, the method in accordance with an embodiment of the present invention provides information on the chemical composition of the resist layer during of after each of the processing steps 9-11. This enables the server 5 to monitor these processes closely and to adapt or correct operational processes already during any of these steps 9-11. For example, in step 9, the exposure dose may be adapted during exposure when it is detected that the exposure process develops too slow. If chemical modification is detected outside an (intended) exposed location, i.e. in a non-exposed location, this may indicate a lack of focus of the exposure beam. Hence the server 5 may decide to change the focus. Also the duration of any step 9-11 may be adapted, or the temperature of the post-exposure bake step 10 or development step 11. A great number of other operational parameters may be adapted dependent on the measurement results of steps 13, 15 and 17. This advantage is provided by the additional information on chemical modifications obtained using the technology applied, and the moment wherein these technologies may be applied (while the steps are ongoing).

In some embodiments, the method is applied to a first substrate and is to be subsequently applied to a second substrate (or a number of substrates subsequently). In accordance herewith, after the resist processing steps have been performed for the first substrate, based on the detected chemical modifications, the method comprises modifying a chemical composition of the resist material to be applied to a substrate surface of the second substrate. This could include changing parameters of the application step, such as adapting the mixture of chemical substances that may be used for the resist material, or changing other process parameters of the application step (e.g. temperature). For example, the weight ratio or volumetric ratio of the chemical substances that are used as the components of the mixture may be adapted.

Figure 3:
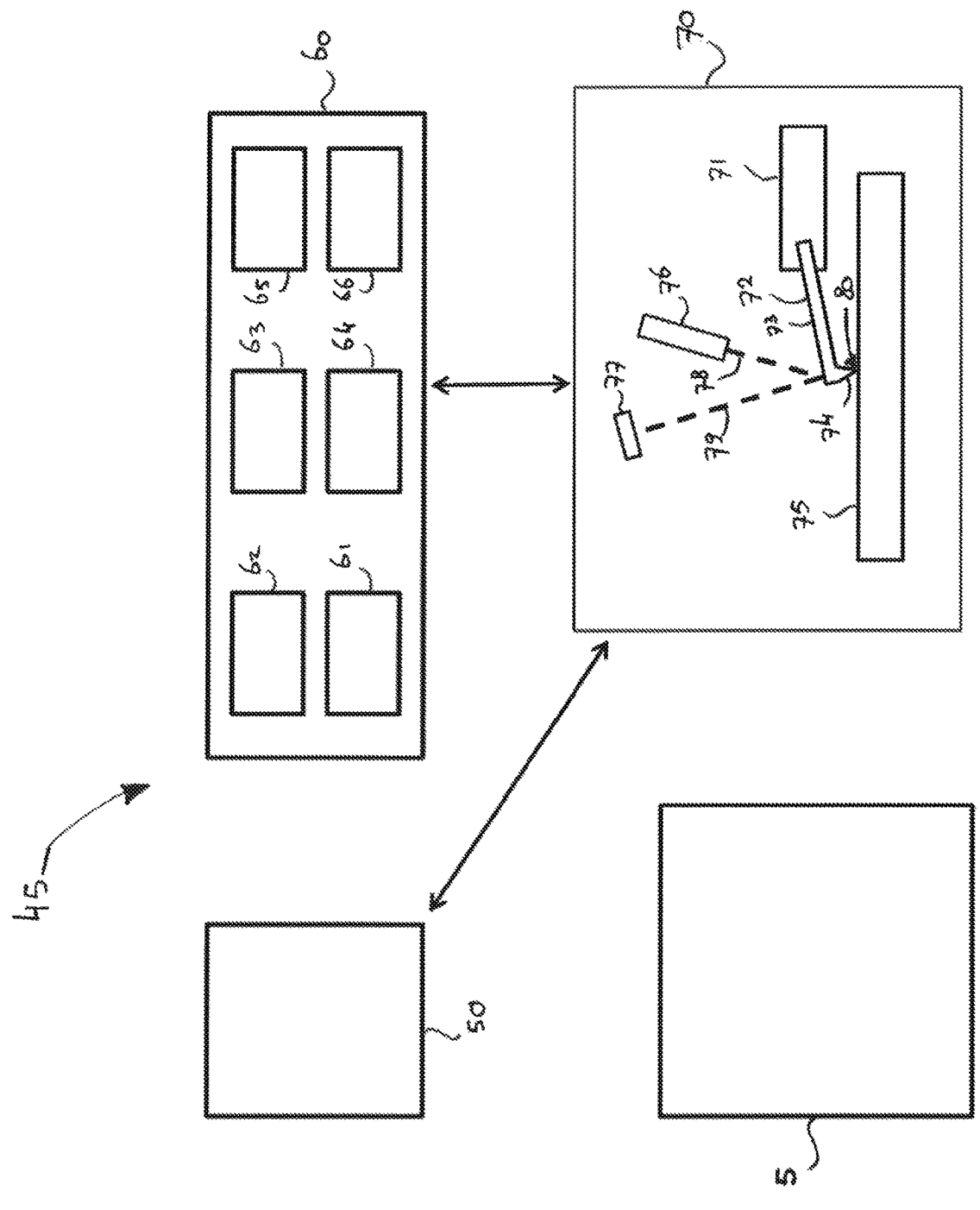
FIG. 3 schematically illustrates a system in accordance with an embodiment of the present invention.

FIG. 3 schematically illustrates a system 45, for performing a method in accordance with the present invention. In FIG. 3, the server 5 also illustrated in FIGS. 1 and 2 controls the operation of devices and units 50, 60 and 70, and the conveying of wafers in between these devices—from device to device. The system further includes a litho scanner 50 which provides for the exposure unit of the system, wherein for example step 9 is performed. Moreover, a track tool 60 performs the other processing steps, such as stripping 41 in unit 61, resist coating 7 in unit 62, soft baking 8 in unit 63, post-exposure baking 10 in unit 64, developing 11 in unit 65, and post baking 12 in unit 66. The measurements steps 13, 15 and 17 are performed by scanning probe microscopy device 70. The SPM device 70 schematically illustrates a scan head 71, including a probe 72 comprising a cantilever 73 and probe tip 74 at the end thereof. The probe tip 74 is manipulated to follow the surface of a sample 75 at a probing area 80. As stated before, following is intended to include contacting the surface and any other known operation modes of the SPM, such as contact mode, non-contact mode, intermittent contact mode. The illustration also shows an optical deflection beam 78 provided by a laser device 76 and impinging on the back of probe tip 74. The back of probe tip 74 is specular reflective, and reflects a reflected fraction 79 of the beam 78 towards photodiode arrangement 77. Although not illustrated in FIG. 3, the scanning probe microscopy device is arranged for performing one or more of the chemical imaging steps described hereinabove. For example, an excitation beam (not shown) may be incident on the probing area to perform PTIR, sSNOM or TERS. For sSNOM and TERS, the probe tip 74 for this reason may be coated with a metal coating. Alternatively or additionally, the probe tip may be coated with a different functional chemical substance to perform chemical force microscopy (CFM) with a functionalized tip. Furthermore, and also alternatively or additionally, means may be present (not shown) to apply and control a bias voltage to the probe tip 74 and to measure an electric current therethrough, such as to perform I-V spectroscopy.

The present invention has been described in terms of some specific embodiments thereof. It will be appreciated that the embodiments shown in the drawings and described herein are intended for illustrated purposes only and are not by any manner or means intended to be restrictive on the invention. It is believed that the operation and construction of the present invention will be apparent from the foregoing description and drawings appended thereto. It will be clear to the skilled person that the invention is not limited to any embodiment herein described and that modifications are possible which should be considered within the scope of the appended claims. Also kinematic inversions are considered inherently disclosed and to be within the scope of the invention. Moreover, any of the components and elements of the various embodiments disclosed may be combined or may be incorporated in other embodiments where considered necessary, desired or preferred, without departing from the scope of the invention as defined in the claims.

In the claims, any reference signs shall not be construed as limiting the claim. The term 'comprising' and 'including' when used in this description or the appended claims should not be construed in an exclusive or exhaustive sense but rather in an inclusive sense. Thus the expression 'comprising' as used herein does not exclude the presence of other elements or steps in addition to those listed in any claim. Furthermore, the words 'a' and 'an' shall not be construed as limited to 'only one', but instead are used to mean 'at least one', and do not exclude a plurality. Features that are not specifically or explicitly described or claimed may be additionally included in the structure of the invention within its scope. Expressions such as: "means for . . . " should be read as: "component configured for . . . " or "member constructed to . . . " and should be construed to include equivalents for the structures disclosed. The use of expressions like: "critical", "preferred", "especially preferred" etc. is not intended to limit the invention. Additions, deletions, and modifications within the purview of the skilled person may generally be made without departing from the spirit and scope of the invention, as is determined by the claims. The invention may be practiced otherwise then as specifically described herein, and is only limited by the appended claims.

The invention claimed is:

1. A lithographic patterning method for creating features on a substrate surface, the lithographic patterning method being performed on a lithographic patterning system, wherein the lithographic patterning system comprises a lithography server, an applicator, an exposure unit, a developer unit and a scanning probe microscopy device, and wherein the method comprising:
   providing, by the applicator, a resist material layer by applying a resist material to the substrate surface;
   performing, by the lithographic patterning system, resist processing operations on the resist material layer, including at least:
      selectively exposing, by the exposure unit, dependent on a location and based on patterning data, the resist material layer to a surface treatment step, so as to provide exposed locations and non-exposed locations, wherein the resist material in the exposed locations is chemically modified during the step of selective exposing; and
      developing, by the developer unit, the resist material layer so as to selectively remove the resist material locally, dependent on whether a location is an exposed location or a non-exposed location;
   wherein the method further comprises obtaining by the lithography server, during or after one or more of the resist processing operations, data indicative of a chemical modification of the resist material for monitoring or evaluating the one or more resist processing operations, the data being obtained by a detecting operation;
   wherein the detecting operation is performed by scanning at least a part of the surface using a scanning probe microscopy device including a probe comprising a cantilever and a probe tip arranged thereupon,
   wherein the scanning includes following the surface with the probe tip in a probing area,
   wherein the probing area coincides with at least one location of the exposed locations and non-exposed locations, for locally detecting the chemical modification;
   wherein operating the lithographic patterning system is controlled by the lithography server, and
   wherein the method further comprises modifying, by the lithography server based on the locally detected chemical modifications, one or more operational parameters of at least one of the resist processing operations, for controlling the resist processing operations during operation of the method.

2. The lithographic patterning method according to claim 1, wherein the detecting further comprises:
   directing a first optical beam onto the probe tip and detecting a reflected fraction of the first optical beam by an optical beam deflection sensor for measuring a position of the probe tip relative to the surface;
   directing a second optical beam at the probing area on the surface, wherein the second optical beam is a pulsed infrared laser beam; and
   monitoring the measured position of the probe tip for obtaining a sensor signal indicative of infrared absorption at the probing area.

3. The lithographic patterning method according to claim 1, wherein the probe tip is provided with a functional coating, the functional coating comprising at least one of a metal, silicon or silicon oxide, and wherein the detecting further comprises:
   directing an optical excitation beam at the probing area, wherein the optical excitation beam is an infrared laser beam;
   collecting a scattered fraction of the optical excitation beam; and analyzing the scattered fraction for detecting variations in a molecular structure at the probing area, so as to provide a sensor signal indicative of said variations.

4. The lithographic patterning method according to claim 1, wherein the probe tip is provided with a functional coating, the functional coating comprising at least one of a metal, silicon or silicon oxide, and wherein the detecting further comprises:
directing an optical excitation beam at the probing area, wherein the optical excitation beam comprises a laser beam of visible light;
collecting a Raman scattered fraction of the optical excitation beam scattered at the probing area; and
analyzing the Raman scattered fraction using a spectrometer for obtaining a Raman spectrum of the resist material at the probing area, so as to provide a sensor signal indicative of a chemical composition.

5. The lithographic patterning method according to claim 1, wherein the probe is electrically conductive, and wherein the detecting further comprises:
applying, to the probe tip while in contact with the probing area, one or more bias voltages of a range of bias voltages; and
measuring an electric current through the probe tip in response to the one or more bias voltages, for obtaining a voltage-current relation at the probing area.

6. The lithographic patterning method according to claim 1, wherein the detecting comprises a scanning probe microscopy chemical imaging operation.

7. The lithographic patterning method according to claim 1, wherein the photoresist material comprises at least one element taken from the group consisting of: a non-chemically amplified resist; a chemically amplified resist; a resist comprising hafnium oxide nanoparticles; and a resist comprising zirconium oxide nanoparticles.

8. The lithographic patterning method according to claim 1, wherein the resist processing operations further comprise a post-exposure baking operation.

9. The lithographic patterning method according to claim 1, wherein the method is applied to a first substrate and is to be subsequently applied to a second substrate, and
wherein the method further comprises performing, after the resist processing operations have been performed for the first substrate modifying, for the second substrate, a chemical composition of the resist material to be applied to a substrate surface of the second substrate.

10. The lithographic patterning method according to claim 1, wherein the detecting is performed by carrying out at least one operation taken from the group consisting of:
scanning the at least part of the surface of the substrate multiple times so as to perform at least two detection steps; and
scanning the at least part of the surface of the substrate simultaneously with a plurality of probes, so as to perform at least two detection steps; and
wherein the method further comprises combining measurement data obtained by said at least two detection steps.

11. A system for performing a lithographic patterning method for creating features on a surface of a substrate, wherein the system comprises:
a lithography server, the lithography server being configured for at least one of controlling the lithographic patterning method and for acquiring data for monitoring or evaluating one or more resist processing operations of the lithographic patterning method;
an applicator for applying a resist material to a surface of a substrate for providing a resist material layer;
an exposure unit configured to selectively expose, dependent on a location and based on patterning data, the resist material layer to a surface treatment operation, so as to provide exposed locations and non-exposed locations, wherein the resist material in the exposed locations is chemically modified during the selective exposing; and
a developer unit for developing the resist material layer such as to selectively remove the resist material locally, dependent on whether a location is an exposed location or a non-exposed location;
wherein the lithography server is configured for obtaining, during or after one or more of the resist processing operations, data indicative of a chemical modification of the resist material for monitoring or evaluating the one or more resist processing operations,
wherein the lithography server cooperates with a scanning probe microscopy device for detecting the chemical modification and providing the data, wherein the scanning probe microscopy device is configured for scanning at least a part of the surface, wherein the scanning probe microscopy device includes a probe comprising a cantilever and a probe tip arranged on the cantilever, wherein the scanning probe microscopy device is configured for following the surface with the probe tip in a probing area, wherein the probing area coincides with at least one location of the exposed locations and non-exposed locations, for locally detecting the chemical modification;
wherein the lithography server is configured for performing, based on the locally detected chemical modifications, an operation of modifying one or more operational parameters of at least one of the applicator, the exposure unit, or the developer unit, for modifying a resist processing operation during operation of the method via the applicator, the exposure unit, or the developer unit.

12. The system according to claim 11, wherein the scanning probe microscopy device is configured for:
directing, from a first optical source, a first optical beam onto the probe tip and detecting a reflected fraction of the first optical beam by an optical beam deflection sensor for measuring a position of the probe tip relative to the surface;
directing, from a second optical source, a second optical beam at the probing area on the surface, wherein the second optical beam is a pulsed infrared laser beam; and
monitoring the measured position of the probe tip for obtaining a sensor signal indicative of infrared absorption at the probing area.

13. The system according to claim 11, wherein the probe tip of the scanning probe microscopy device is provided with a metal coating, and wherein the scanning probe microscopy device is configured for:
directing, by an optical excitation source, an optical excitation beam at the probing area, wherein the optical excitation beam is an infrared laser beam;
collecting, using an optical sensor, a scattered fraction of the optical excitation beam; and
analyzing the scattered fraction for detecting variations in a molecular structure at the probing area, such as to provide a sensor signal indicative of said variations.

14. The system according to claim 11, wherein the probe tip of the scanning probe microscopy device is provided with a metal coating, and wherein the scanning probe microscopy device is configured for:
  directing, by an optical excitation source, an optical excitation beam at the probing area, wherein the optical excitation beam comprises a laser beam of visible light;
  collecting, using an optical sensor, a Raman scattered fraction of the optical excitation beam scattered at the probing area; and
  analyzing, using a spectrometer, the Raman scattered fraction for obtaining a Raman spectrum of the resist material at the probing area, such as to provide a sensor signal indicative of a chemical composition.

15. The system according to claim 11, wherein the scanning probe microscopy device is configured for:
  applying, to the probe tip while in contact with the probing area, one or more bias voltages of a range of bias voltages; and
  measuring an electric current through the probe tip in response to the one or more bias voltages, for obtaining a voltage-current relation at the probing area.

16. The system according to claim 11, wherein the scanning probe microscopy device is configured for performing a scanning probe microscopy chemical imaging operation, preferably including one or more elements of a group comprising: topography and recognition imaging (TREC), or chemical force microscopy with a functionalized probe tip.

17. The system according to claim 11, wherein the lithography server is configured for modifying, for a further substrate, a chemical composition of the resist material to be applied to a substrate surface of the further substrate in a subsequent application of the lithographic patterning method.

18. The system according to claim 16, wherein the scanning probe microscopy device is configured for performing a scanning probe microscopy chemical imaging operation including one or more elements of the group consisting of: topography and recognition imaging (TREC), and chemical force microscopy with a functionalized probe tip.

19. The lithographic patterning method according to claim 6, wherein the detecting comprises a scanning probe microscopy chemical imaging operation including one or more elements of the group consisting of: topography and recognition imaging (TREC), or chemical force microscopy with a functionalized probe tip.

20. The lithographic patterning method according to claim 9, wherein the modifying the chemical composition of the resist material comprises one or more of the group consisting of:
  adapting a mixture of chemical substances used for the resist material; and
  changing a process parameter of the step of applying the resist material.

* * * * *